(12) United States Patent
Suzuki et al.

(10) Patent No.: US 7,663,960 B2
(45) Date of Patent: Feb. 16, 2010

(54) VOLTAGE SUPPLY CIRCUIT AND SEMICONDUCTOR MEMORY

(75) Inventors: Toshihiro Suzuki, Kawasaki (JP); Yoshikazu Takeyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 12/133,701

(22) Filed: Jun. 5, 2008

(65) Prior Publication Data
US 2008/0304349 A1    Dec. 11, 2008

(30) Foreign Application Priority Data
Jun. 6, 2007  (JP) ............................. 2007-150015

(51) Int. Cl.
  *G11C 5/14*  (2006.01)
(52) U.S. Cl. .................. 365/226; 365/189.11; 365/233
(58) Field of Classification Search ................. 365/226, 365/189.07, 189.11, 233
  See application file for complete search history.

(56) References Cited

U.S. PATENT DOCUMENTS 7,200,066 B2 *   4/2007   Krenzke et al. ............. 365/226
2005/0168263 A1   8/2005   Fukuda et al.
2007/0001771 A1 * 1/2007   Hori et al. ..................... 331/57
2007/0014176 A1 * 1/2007   Krenzke et al. ............. 365/226

FOREIGN PATENT DOCUMENTS

JP          11-154396          6/1999

OTHER PUBLICATIONS

U.S. Appl. No. 11/393,984, filed Nov. 14, 2007, Jun Nakai, et al.

* cited by examiner

*Primary Examiner*—Son Dinh
(74) *Attorney, Agent, or Firm*—Oblon, Spivak, McClelland, Maier & Neustadt, L.L.P.

(57) ABSTRACT

A voltage supply circuit that switches and outputs multiple set voltages from an output terminal, has a boosting circuit that boosts a voltage supplied from a power supply and outputs the voltage to the output terminal; a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage; and a control circuit that controls an operation of the boosting circuit in response to the set voltage and the output signal of the voltage detecting circuit.

19 Claims, 12 Drawing Sheets

VOLTAGE SUPPLY CIRCUIT AND SEMICONDUCTOR MEMORY

CROSS-REFERENCE TO RELATED APPLICATION

This application is based upon and claims the benefit of priority from the prior Japanese Patent Application No. 2007-150015, filed on Jun. 6, 2007, the entire contents of which are incorporated herein by reference.

BACKGROUND OF THE INVENTION

1. Field of the Invention

The present invention relates to a voltage supply circuit including a boosting circuit for boosting a power supply voltage, and a semiconductor memory.

2. Background Art

Conventionally, for example, semiconductor memories such as NAND flash memories include voltage supply circuits for supplying power supply voltages having been boosted by boosting circuits.

For example, semiconductor memories such as NAND flash memories require higher potentials than power supply voltages for writing, erasing, and reading data. Thus the voltage supply circuit of such a semiconductor memory includes a boosting circuit for boosting a power supply voltage and a voltage detecting circuit for keeping the potential at a set potential.

In the boosting circuit, MOS transistors and capacitances are connected in series and one ends of the capacitance are connected via complementary CLK and CLKB signals to boost the power supply voltage.

The voltage detecting circuit includes a voltage dividing circuit and a comparator. In the voltage detecting circuit, a boosting circuit output terminal and a ground potential are connected in series via the voltage dividing circuit, and a monitor potential outputted from the voltage dividing circuit and a reference potential are compared with each other by the comparator.

A plurality of n-type MOS transistors having sources set at a ground potential are connected from the junction of the voltage dividing resistor of the voltage dividing circuit and the gates of the transistors are each fed with a selection signal. The selection signal determines the set potential of an output from the boosting circuit. In other words, the detection level of the voltage detecting circuit can be changed.

In this case, for example, when the output from the boosting circuit is lower than the set potential, the monitor potential falls below the reference potential and the comparator switches the output to, e.g., "High". The output activates the boosting circuits and the output from the boosting circuit is boosted in response to the CLK/CLKB signals.

Conversely, when the output from the boosting circuit is higher than the set potential, the monitor potential becomes higher than the reference potential and the comparator switches the output to, e.g., "Low". The output deactivates the boosting circuit and interrupts the CLK/CLKB signals to stop the boosting operation of the boosting circuit.

In this way, the voltage detecting circuit activates and deactivates the boosting circuit, so that the output from the boosting circuit can be kept near the set potential.

A voltage supply circuit of the prior art includes a plurality of boosting circuits for boosting a voltage supplied from a power supply and generating an output voltage, a plurality of CP output control circuits for monitoring the output voltage and outputting signals for instructing the boosting circuits to be activated or deactivated, an oscillator fed with the outputs (voltages for performing OSC control) of the CP output control circuits, and a clock buffer circuit which is fed with the oscillation output of the oscillator and outputs signals to the boosting circuits (for example, see Japanese Patent Laid-Open No. 11-154396).

The CP output control circuits are so designed as to vary in output detecting voltage, so that a step-by-step operation is performed according to a change of the output voltage.

SUMMARY OF THE INVENTION

According to one aspect of the present invention, there is provided: a semiconductor memory, comprising:

memory cells; and a voltage supply circuit that switches and outputs multiple set voltages from an output terminal and supplies a voltage to the memory cells, the voltage supply circuit comprising:

a boosting circuit that boosts a voltage supplied from a power supply and outputs the voltage to the output terminal;

a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage; and a control circuit that controls an operation of the boosting circuit in response to the set voltage and the output signal of the voltage detecting circuit, wherein the control circuit controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal, controls the activated boosting circuit so as to deactivate the boosting circuit in response to the first flag signal, increases at least the second frequency when the set voltage is changed to a higher voltage, and reduces at least the second frequency when the set voltage is changed to a lower voltage.

According to the other aspect of the present invention, there is provided: a semiconductor memory, comprising:

memory cells; and a voltage supply circuit that switches and outputs multiple set voltages from an output terminal and supplies a voltage to the memory cells, the voltage supply circuit comprising:

a boosting circuit that boosts a voltage supplied from a power supply and outputs the voltage to the output terminal;

a filter circuit which has a variable resistor connected between an output of the boosting circuit and the output terminal and filters the voltage outputted from the boosting circuit;

a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage, and outputs a third flag signal when detecting that the voltage outputted from the boosting circuit is not lower than a resistance adjusting voltage set lower than the set voltage; and a control circuit that controls an operation of the boosting circuit in response to the set voltage and the output signal of the voltage detecting circuit, and controls the filter circuit at least in response to the output signal of the voltage detecting circuit, wherein the control circuit controls the filter circuit so as to change a resistance value of the variable resistor from a first resistance value to a second resistance value larger than the first resistance value in response to the third flag signal, controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal, controls the activated boosting circuit so as to deactivate the boosting circuit in response to the first flag signal, increases at least the second frequency when the set voltage is changed to a higher voltage, and reduces at least the second frequency when the set voltage is changed to a lower voltage.

According to still further aspect of the present invention, there is provided: a voltage supply circuit that switches and outputs multiple set voltages from an output terminal, comprising:

a boosting circuit that boosts a voltage supplied from a power supply and outputs the voltage to the output terminal;

a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage; and a control circuit that controls an operation of the boosting circuit in response to the set voltage and the output signal of the voltage detecting circuit, wherein the control circuit controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal, controls the activated boosting circuit so as to deactivate the boosting circuit in response to the first flag signal, increases at least the second frequency when the set voltage is changed to a higher voltage, and reduces at least the second frequency when the set voltage is changed to a lower voltage.

DETAILED DESCRIPTION

Figure 1:
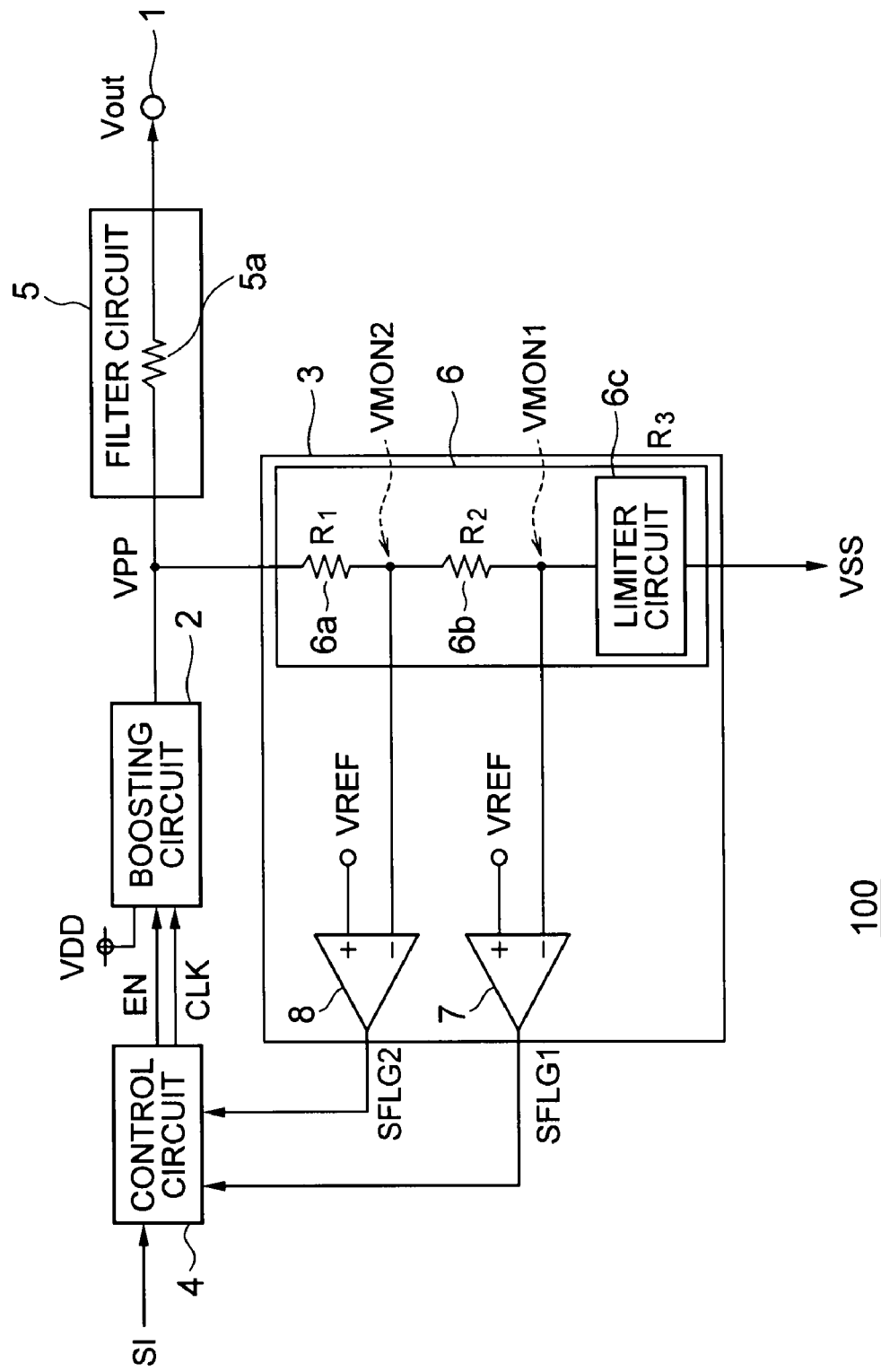
FIG. 1 shows the configuration of the main part of a voltage supply circuit 100 according to a first embodiment which is an aspect of the present invention.

In the boosting operation, the output voltage is not always kept at a constant potential but fluctuates around the set potential. This phenomenon is called a ripple which increases or decreases with an RC time constant based on the resistance value of the voltage dividing resistor, the operation delay of the comparator, and the boosting capability of the boosting circuit. The ripple increases when the voltage dividing resistor has a large resistance value, the comparator has a large operation delay, and the boosting circuit has a high boosting capability.

When each voltage dividing resistor has an equal resistance value and the same comparator is used, the response speed of the voltage detecting circuit remains constant relative to fluctuations in the potential of the boosting circuit. Therefore, the switching time of the output of the voltage detecting circuit substantially remains constant.

Further, the output voltage and the output current of the boosting circuit have the following relationship: the output current decreases with an increase in the output voltage of the boosting circuit, and the output current increases with a decrease in the output voltage of the boosting circuit.

Therefore, in view of the output from the boosting circuit when the voltage detecting circuit has a low set potential, the ripple increases because a large current can be outputted in a fixed time period.

On the other hand, when the voltage detecting circuit has a high set potential, the ripple decreases because only a small current can be outputted in the fixed time period.

In another aspect, data is written in the cells of a NAND flash memory by using a potential boosted by the boosting circuit.

However, the cells do not all have uniform characteristics and vary in writing potential enabling writing.

In a known method, in order to sequentially complete writing from a cell having a low writing potential to a cell having a high writing potential, the writing potential is gradually increased from a proper initial value and data is written each time the writing potential is increased.

In order to achieve this operation, each voltage dividing resistor of the voltage detecting circuit for determining the set potential of the boosting circuit is adjusted to obtain a desired potential from the output of the boosting circuit so as to gradually increase the desired potential.

When the set potential is changed, as described above, the output from the boosting circuit disadvantageously has a large ripple at a low set potential.

In a writing operation on the cells of a NAND flash memory, large ripples on the word lines of selected cells and unselected cells expand, e.g., the Vth distribution of the written cells and cause erroneous writing on the unselected cells. Therefore, small ripples are more desirable.

However, as described above, when each voltage dividing resistor of the voltage detecting circuit is adjusted to set a low output for the boosting circuit during writing on a cell having a low writing potential, a conventional circuit has a large ripple and deteriorates writing characteristics on memory cells.

Then, in the voltage supply circuit of the prior art, the number of boosting circuits to be operated is controlled step-by-step according to a change of the output voltage in order to reduce a ripple at a certain set potential.

In other words, the prior art does not reduce ripples at a plurality of set potentials.

Exemplary embodiments of the present invention will now be described in accordance with the accompanying drawings.

First Embodiment

FIG. 1 shows the configuration of the main part of a voltage supply circuit 100 according to a first embodiment which is an aspect of the present invention.

As shown in FIG. 1, a voltage supply circuit 100 includes an output terminal 1, a boosting circuit 2, a voltage detecting circuit 3, a control circuit 4, and a filter circuit 5. The voltage supply circuit 100 switches multiple set voltages in response to a control signal S1 and outputs an output voltage Vout from the output terminal 1.

The boosting circuit 2 outputs a voltage VPP obtained by boosting a voltage supplied from a power supply VDD, to the output terminal 1 through the filter circuit 5.

The voltage detecting circuit 3 includes a voltage dividing circuit 6, a first comparator 7, and a second comparator 8.

The voltage dividing circuit 6 includes a resistor 6a which has one end connected to the output of the boosting circuit 2 and has a resistance value of R1, a resistor 6b which has one end connected to the other end of the resistor 6a and has a resistance value of R2, and a limiter circuit 6c which is connected between the other end of the resistor 6b and ground VSS and has a resistance value of R3.

The voltage dividing circuit 6 divides, at a first voltage dividing ratio of (R3)/(R1+R2+R3), the voltage VPP outputted from the boosting circuit 2 and outputs a first monitor voltage VMON1 from the junction of the resistor 6b and the limiter circuit 6c.

Further, the voltage dividing circuit 6 divides the voltage VPP outputted from the boosting circuit 2 at a second voltage dividing ratio of (R2+R3)/(R1+R2+R3) which is larger than the first voltage dividing ratio, and outputs a second monitor voltage VMON2 from the junction of the resistor 6a and the resistor 6b.

The limiter circuit 6c is made up of, for example, a variable resistor. The limiter circuit 6c is controlled so as to reduce the resistance value R3 when a set voltage Vset is high, whereas the limiter circuit 6c is controlled so as to increase the resistance value R3 when the set voltage Vset is low. Thus the first and second voltage dividing ratios are controlled according to the set voltage Vset.

The first comparator 7 has the inverting input terminal fed with the first monitor voltage VMON1 and the non-inverting input terminal fed with a reference voltage VREF and outputs a first flag signal SFLG1 to the control circuit 4.

The second comparator 8 has the inverting input terminal fed with the second monitor voltage VMON2 and the non-inverting input terminal fed with the reference voltage VREF and outputs a second flag signal SFLG2 to the control circuit 4.

In this configuration, when the voltage detecting circuit 3 detects that the voltage VPP outputted from the boosting circuit 2 is not lower than the set voltage Vset, the voltage detecting circuit 3 outputs the first flag signal SFLG1. Further, when the voltage detecting circuit 3 detects that the voltage VPP outputted from the boosting circuit 2 is not lower than a frequency adjusting voltage Vf set lower than the set voltage Vset, the voltage detecting circuit 3 outputs the second flag signal SFLG2.

The control circuit 4 controls the boosting operation of the boosting circuit 2 according to the set voltage Vset and the voltage VPP outputted from the boosting circuit 2. In other words, the control circuit 4 outputs an enable signal EN and a clock signal CLK to the boosting circuit 2 in response to the control signal S1 including information about the set voltage Vset and the output signals (SFLG1 and SFLG2) of the voltage detecting circuit 3. The enable signal EN activates the boosting circuit 2, and the boosting circuit 2 performs a boosting operation in response to the clock signal CLK.

For example, the control circuit 4 changes the frequency of the clock signal CLK from a first frequency f1 to a second frequency f2 lower than the first frequency f1 in response to the second flag signal SFLG2, so that activated boosting circuit 2 is controlled to have a lower boosting capability. Further, the control circuit 4 stops the output of the enable signal EN in response to the first flag signal SFLG1, so that the activated boosting circuit 2 is controlled to be deactivated.

Moreover, when the set voltage Vset is changed to a higher voltage, the control circuit 4 increases the first frequency f1 to improve the boosting capability of the boosting circuit 2. When the set voltage Vset is changed to a lower voltage, the control circuit 4 reduces the first frequency f1 to reduce the boosting capability of the boosting circuit 2.

The control circuit 4 may increase, when the set voltage Vset is changed to a higher voltage, the second frequency f2 to improve the boosting capability of the boosting circuit 2 near the set voltage Vset.

Further, the control circuit 4 may reduce, when the set voltage Vset is changed to a lower voltage, the second frequency f2 to reduce the boosting capability of the boosting circuit 2 near the set voltage Vset.

Moreover, the control circuit 4 may increase the first frequency f1 and the second frequency f2 when the set voltage Vset is changed to a higher voltage.

Further, the control circuit 4 may reduce the first frequency f1 and the second frequency f2 when the set voltage Vset is changed to a lower voltage.

The filter circuit 5 includes a resistor 5a connected between the output of the boosting circuit 2 and the output terminal 1. The filter circuit 5 filters the voltage VPP outputted from the boosting circuit 2 and reduces the ripple of the output voltage Vout.

Figure 2:
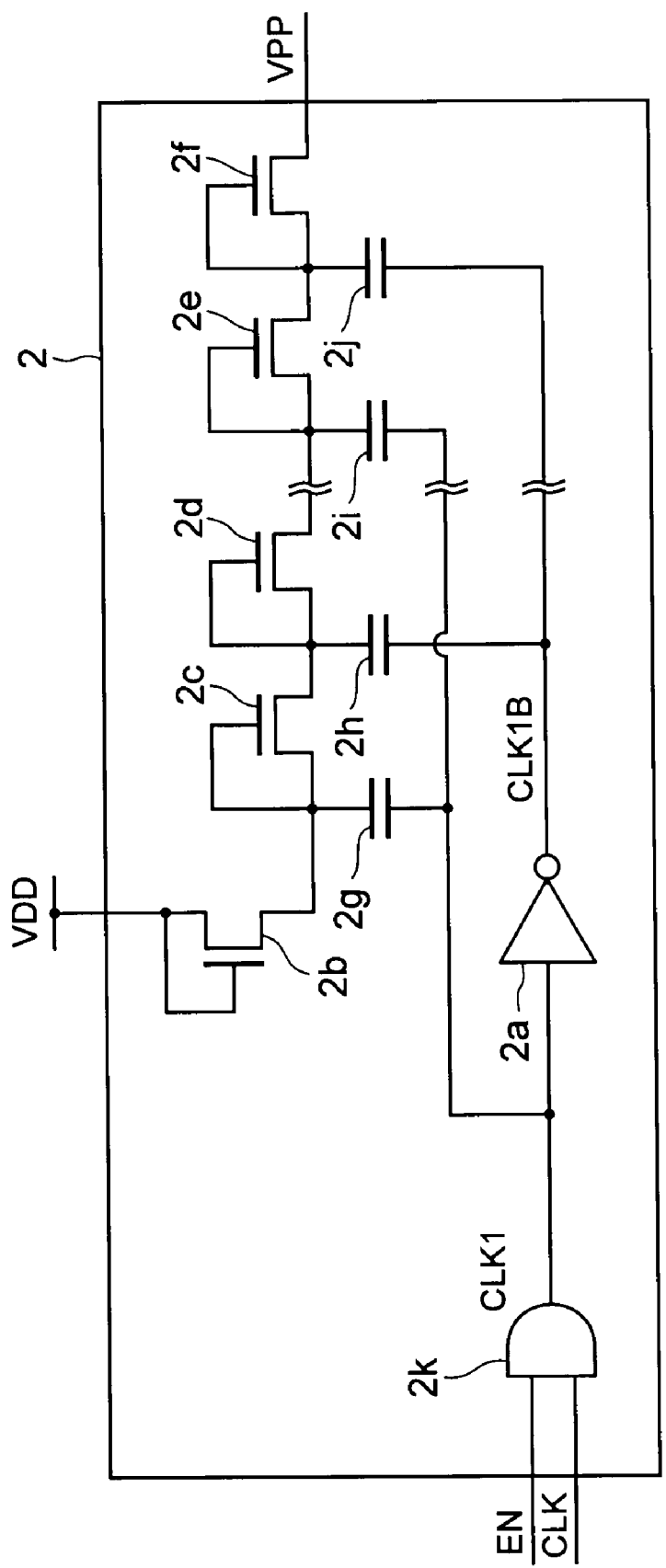
FIG. 2 is a circuit diagram showing the example of the boosting circuit applied to the voltage supply circuit 100 of FIG. 1.

The following is an example of the specific configuration of the boosting circuit 2. FIG. 2 is a circuit diagram showing the example of the boosting circuit applied to the voltage supply circuit 100 of FIG. 1.

As shown in FIG. 2, for example, the boosting circuit 2 includes a MOS transistor 2b which has the source connected to the power supply VDD and the source and gate connected to each other, MOS transistors 2c to 2f which are connected in series between the drain of the MOS transistor 2b and the output of the boosting circuit 2 and have the sources and gates connected to each other, and capacitors 2g to 2j which are connected to the sources of the MOS transistors 2c to 2f, respectively.

Further, the boosting circuit 2 includes an AND circuit 2k which is fed with the enable signal EN and the clock signal CLK and outputs a first clock signal CLK1, and an inverter 2a which is fed with the first clock signal CLK1 and outputs an inverted signal CLK1B of the first clock signal CLK1.

In this configuration, the first clock signal CLK1 is inputted to the capacitors 2g and 2i and the inverted clock signal CLK1B is inputted to the capacitors 2h and 2j.

In other words, for example, the clock signal CLK inputted to the boosting circuit 2 alternately operates the MOS transistors 2c to 2f, sequentially charges the capacitors 2g to 2j, and boosts the voltages of the capacitors 2g to 2j. A potential boosted thus is outputted as the output voltage VPP.

Further, the boosting capability of the boosting circuit 2 can be reduced by reducing the frequency of the clock signal CLK and can be increased by increasing the frequency of the clock signal CLK.

Moreover, the boosting performance of the boosting circuit 2 can be improved by increasing the capacitances of the capacitors 2g to 2j.

The boosting circuit 2 in FIG. 2 is shown merely as an example. Any boosting circuit may be applied to the present embodiment as long as the voltage of the power supply VDD is boosted and outputted based on the input of the clock signal CLK.

Figure 3:
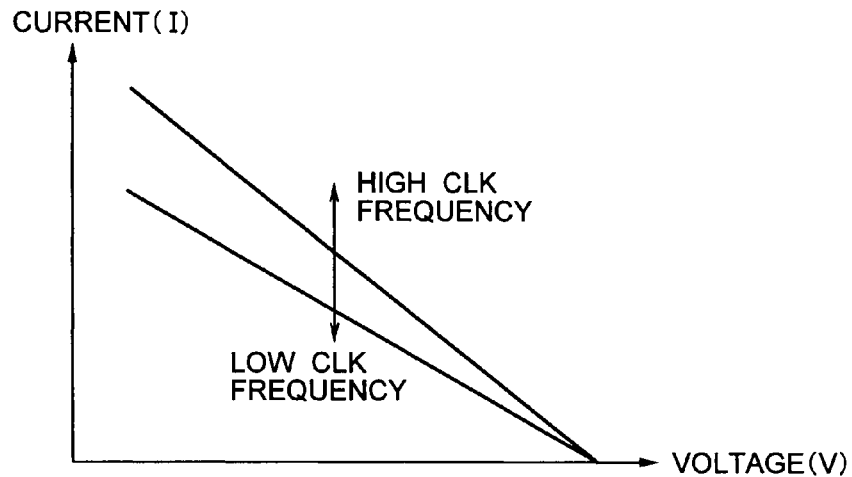
FIG. 3 shows the relationship between a current and a voltage which are outputted from the boosting circuit when the frequency of the clock signal for operating the boosting circuit is changed.

The following is an examination on the frequency characteristics of the current and voltage of the boosting circuit 2 configured thus. FIG. 3 shows the relationship between a current and a voltage which are outputted from the boosting circuit when the frequency of the clock signal for operating the boosting circuit is changed.

As shown in FIG. 3, as the frequency of the clock signal changes, straight lines vertically move which indicate that the current supply capability (boosting capability) of the boosting circuit is increased by raising the frequency of the clock signal. Since the straight lines are negatively inclined in FIG. 3, it can be considered that the boosting capability of the boosting circuit increases when a low voltage is outputted rather than a high voltage.

Figure 4:
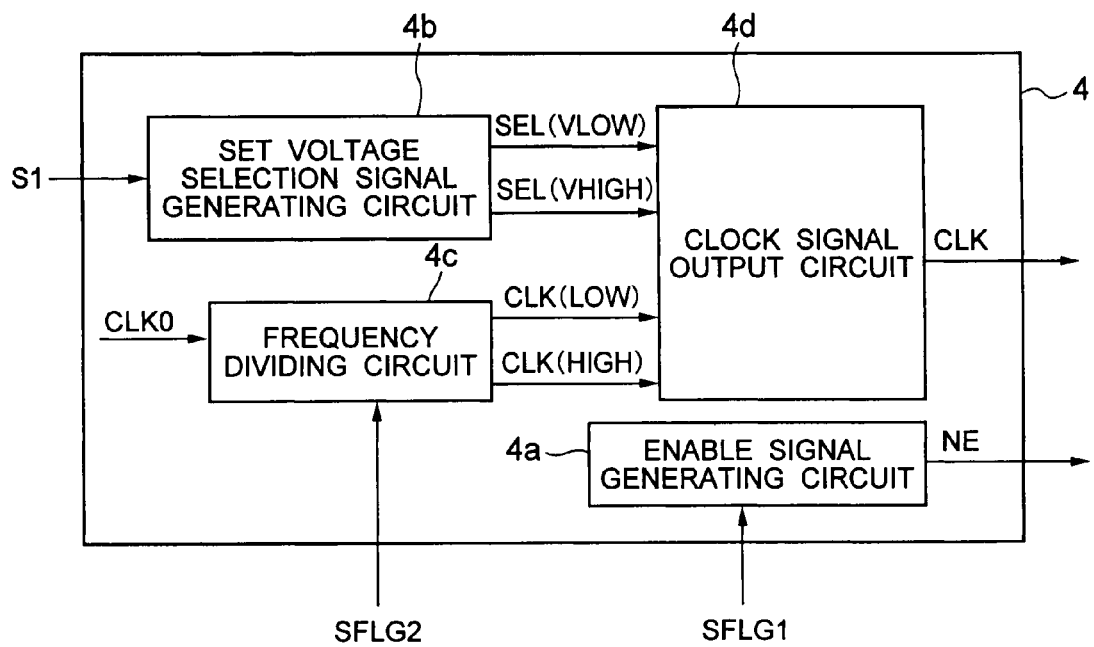
FIG. 4 is a block diagram showing an example of the control circuit applied to the voltage supply circuit 100 of FIG. 1.

The following is an example of the specific configuration of the control circuit 4. FIG. 4 is a block diagram showing an example of the control circuit applied to the voltage supply circuit 100 of FIG. 1.

As shown in FIG. 4, the control circuit 4 includes an enable signal generating circuit 4a, a set voltage selection signal generating circuit 4b, a frequency dividing circuit 4c, and a clock signal output circuit 4d.

When the enable signal generating circuit 4a is not fed with the first flag signal SFLG1, the enable signal generating circuit 4a generates the enable signal EN and outputs the signal to the boosting circuit 2. When the enable signal generating circuit 4a is fed with the first flag signal SFLG1, the enable signal generating circuit 4a stops the output of the enable signal EN.

Thus the control circuit 4 controls the activated boosting circuit 2 to be deactivated in response to the first flag signal SFLG1.

The set voltage selection signal generating circuit 4b is fed with the control signal S1 and outputs a selection signal corresponding to the set voltage Vset which is set by the control signal S1.

For example, when the control signal S1 sets a first highly set voltage Vset1, the set voltage selection signal generating circuit 4b outputs a selection signal SEL (VHIGH). When the control signal S1 sets a second low set voltage Vset2, the set voltage selection signal generating circuit 4b outputs a selection signal SEL (VLOW).

The frequency dividing circuit 4c outputs a clock signal CLK (LOW) and a clock signal CLK (HIGH) having a higher frequency than the clock signal CLK (LOW).

Further, for example, when not fed with a second flag signal SFLG2, the frequency dividing circuit 4c divides the frequency of a reference clock signal CLK0 and outputs the clock signal CLK (HIGH) having the first frequency f1 (HIGH). When fed with the second flag signal SFLG2, the frequency dividing circuit 4c changes the frequency of the clock signal CLK (HIGH) to the second frequency f2 (HIGH) lower than the first frequency f1 (HIGH) and outputs the clock signal CLK.

Similarly, for example, when not fed with the second flag signal SFLG2, the frequency dividing circuit 4c divides the frequency of the reference clock signal CLK0 and outputs the clock signal CLK (LOW) having the first frequency f1 (LOW). When fed with the second flag signal SFLG2, the frequency dividing circuit 4c changes the frequency of the clock signal CLK (LOW) to the second frequency f2 (LOW) lower than the first frequency f1 (LOW) and outputs the clock signal CLK.

When fed with the selection signal SEL (VHIGH), the clock signal output circuit 4d selects the clock signal CLK (HIGH) and outputs the signal as the clock signal CLK. When fed with the selection signal SEL (VLOW), the clock signal output circuit 4d selects the clock signal CLK (LOW) and outputs the signal as the clock signal CLK.

With this configuration, the control circuit 4 can change the frequency of the clock signal CLK for causing the boosting circuit 2 to perform the boosting operation, from the first frequency to the second frequency lower than the first frequency in response to the second flag signal.

Further, when the set voltage Vset is changed to a higher voltage, the control circuit 4 can increase the first frequency and the second frequency (switch from the clock signal CLK (LOW) to the clock signal CLK (HIGH)). In other words, the control circuit 4 can switch the frequency setting of the clock signal CLK having been set at the first frequency f1 (LOW) and the second frequency f2 (LOW) to the frequency setting of the clock signal CLK having been set at the first frequency f1 (HIGH) and the second frequency f2 (HIGH).

When the set voltage Vset is changed to a lower voltage, the control circuit 4 can reduce the first frequency and the second frequency (switch from the clock signal CLK (HIGH) to the clock signal CLK (LOW)). In other words, the control circuit 4 can switch the frequency setting of the clock signal CLK having been set at the first frequency f1 (HIGH) and the second frequency f2 (HIGH) to the frequency setting of the clock signal CLK having been set at the first frequency f1 (LOW) and the second frequency f2 (LOW).

The following will discuss the boosting operation of the voltage supply circuit 100 configured thus.

Figure 5:
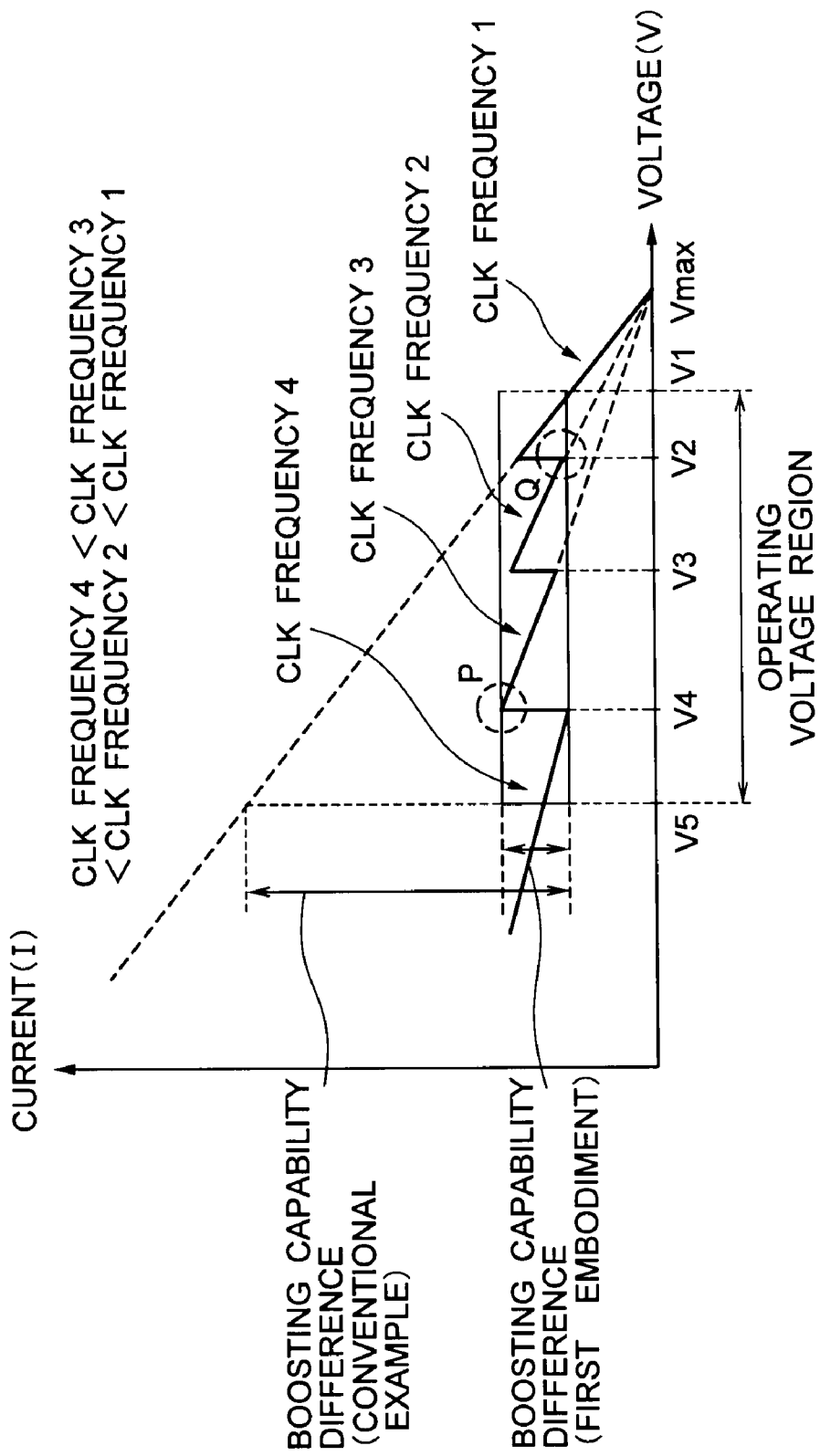
FIG. 5 shows the relationship between the output current and the output voltage of the voltage supply circuit 100 according to the first embodiment of the present invention.

FIG. 5 shows the relationship between the output current and the output voltage of the voltage supply circuit 100 according to the first embodiment of the present invention.

As shown in FIG. 5, when the frequency of the clock signal is changed in response to the set voltage Vset (for example, changed at V2, V3 and V4), the current-voltage characteristics are shaped like a zigzag line (the first embodiment). For example, the boosting circuit has the maximum capability at point P and the minimum capability at point Q in an operating voltage region.

On the other hand, in a conventional example indicated by dotted lines, the boosting capability is minimized at the highest output voltage and is maximized at the lowest output voltage in the operating voltage region.

In this way, the voltage supply circuit 100 of the first embodiment can reduce a difference in boosting capability as compared with the conventional example. Therefore, it is possible to ensure a more uniform boosting time period until a set voltage and achieve more a uniform ripple regardless of the output voltage.

As described above, for example, when the set voltage Vset is changed to a higher voltage, the control circuit 4 increases the first frequency f1 and the second frequency f2 of the clock signal for controlling the boosting operation of the boosting circuit 2. Further, when the set voltage Vset is changed to a lower voltage, the control circuit 4 reduces the first frequency f1 and the second frequency f2.

Thus when the boosting operation of the boosting circuit 2 is performed in response to the clock signal having the first frequency f1, the rising time of the output voltage Vout can be made more uniform regardless of the output voltage Vout.

Figure 6:
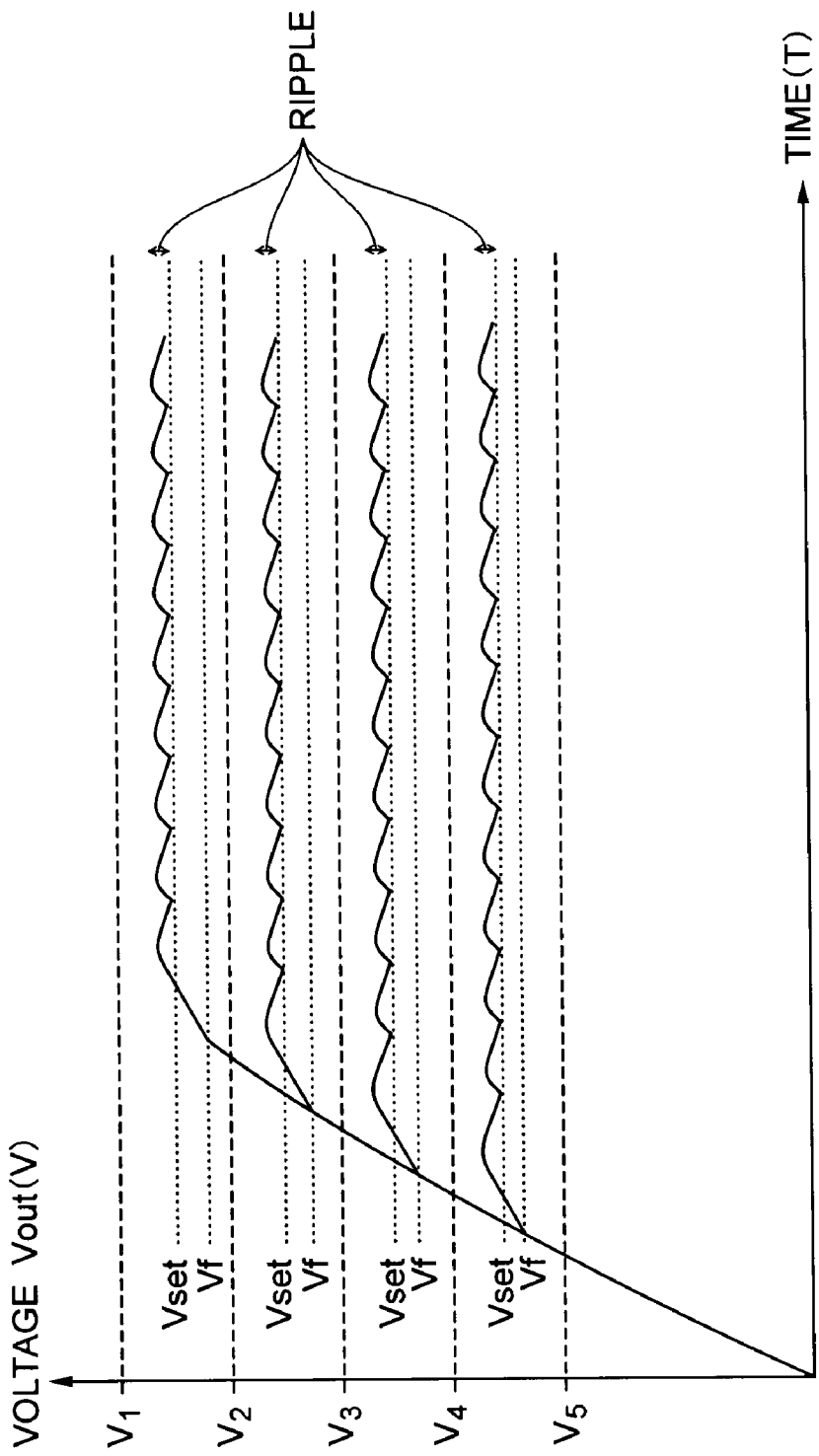
FIG. 6 shows the relationship between the output voltage of the voltage supply circuit 100 and a time according to the first embodiment of the present invention.

FIG. 6 shows the relationship between the output voltage of the voltage supply circuit 100 and a time according to the first embodiment of the present invention.

For example, as shown in FIG. 6, when the boosting operation of the boosting circuit 2 is performed in response to the clock signal having the second frequency f2, the rising speed and ripples of the output voltage Vout are made more uniform regardless of the output voltage Vout.

The following will describe an example in which the voltage supply circuit 100 operating in the foregoing manner is applied to a NAND flash memory.

Figure 7:
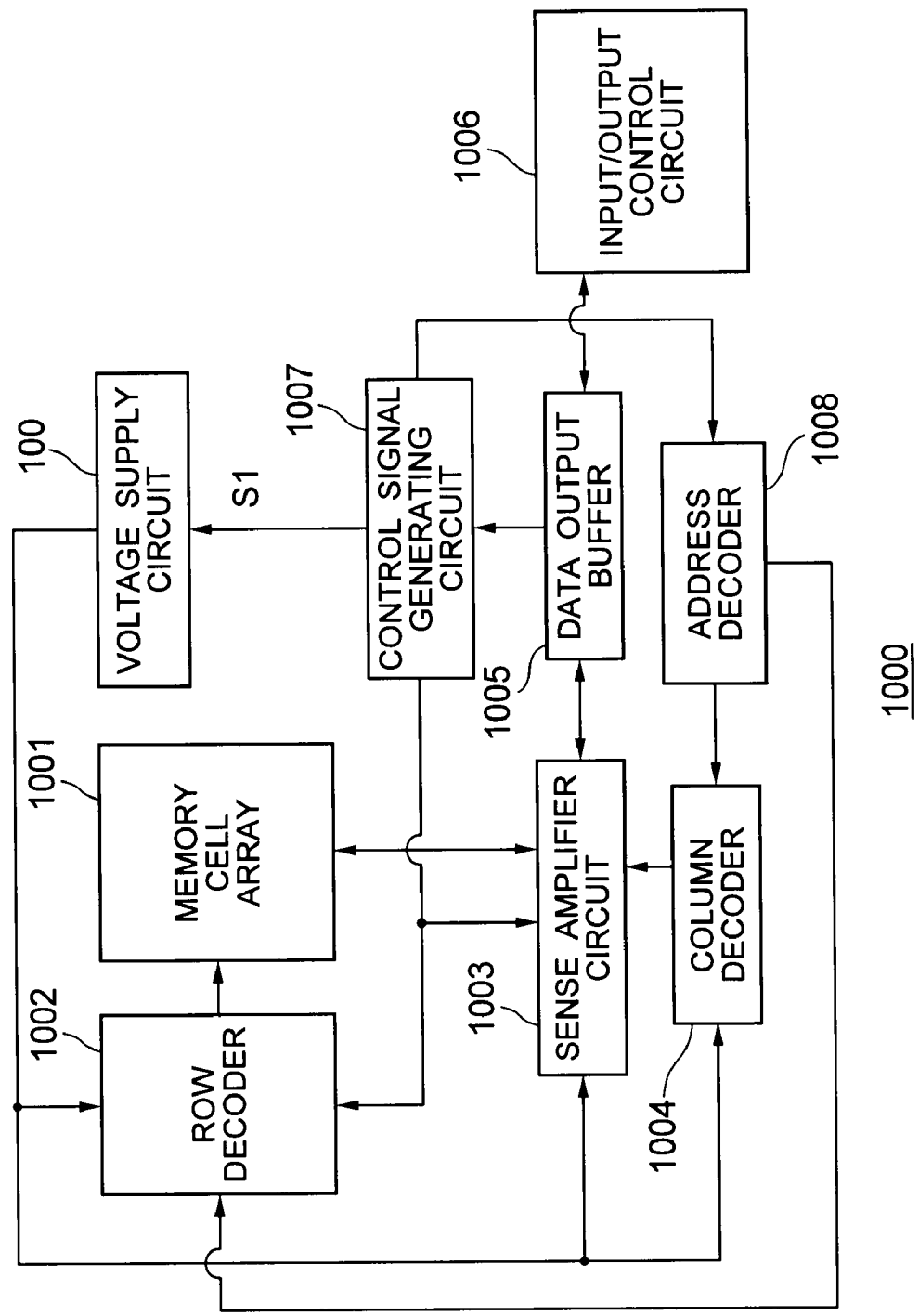
FIG. 7 is a block diagram showing an example of a NAND flash memory including the voltage supply circuit according to the first embodiment which is an aspect of the present invention.

FIG. 7 is a block diagram showing an example of a NAND flash memory including the voltage supply circuit according to the first embodiment which is an aspect of the present invention.

As shown in FIG. 7, a semiconductor memory 1000 which is a NAND flash memory includes the voltage supply circuit 100 of the first embodiment, a memory cell array 1001 including memory cells for storing data, a row decoder 1002, a sense amplifier circuit 1003, a column decoder 1004, a data input/output buffer 1005, an input/output control circuit 1006, a control signal generating circuit 1007, and an address decoder 1008.

The row decoder 1002 is connected to the word lines of the memory cell array 1001. The row decoder 1002 includes a word line driving circuit (not shown) for selecting and driving the word lines of the memory cell array 1001.

The sense amplifier circuit 1003 is connected to the bit lines of the memory cell array 1001. The sense amplifier circuit 1003 reads data stored in the memory cells and holds the read data and data written in the memory cells.

The column decoder 1004 selects the bit lines of the memory cell array 1001.

When data is read, data read by the sense amplifier circuit 1003 is outputted to the input/output control circuit 1006 through the data input/output buffer 1005.

The input/output control circuit 1006 supplies a command to the control signal generating circuit 1007 through the data input/output buffer 1005. The control signal generating circuit 1007 decodes the command.

The control signal generating circuit 1007 is fed with external control signals such as a chip enable signal CE, a writing enable signal WE, a reading enable signal RE, an address latch enable signal ALE, and a command latch enable signal CLE.

The control signal generating circuit 1007 performs sequence control on writing and erasing of data and controls reading of data based on the external control signals and command which are supplied according to an operation mode.

The control signal generating circuit 1007 outputs signals (including the control signal S1) for controlling operations such as reading, writing, and erasing, so that the voltage supply circuit 100 switches multiple set voltages and generates voltages for the operations. The generated voltages are outputted from the output terminal 1 of the voltage supply circuit 100 and are supplied to the memory cells of the memory cell array 1001, for example, through the row decoder 1002.

The addresses of the memory cells are supplied from the input/output control circuit 1006 through the data input/output buffer 1005. The addresses are transferred to the row decoder 1002 and the column decoder 1004 through the address decoder 1008.

The following will examine an advantage obtained by applying the voltage supply circuit of the first embodiment to a semiconductor memory such as a NAND flash memory configured thus.

In some NAND flash memories, multiple threshold voltages (e.g., 8 or 16 threshold voltages) for storing data are set by, for example, changing a quantity of electron stored at the floating gates of a memory cell, so that the NAND flash memories are multivalued. The multivalued memories (particularly, octal and hexadecimal values (8 and 16 threshold voltages)) may disadvantageously have a separated threshold voltage distribution, data interference from surrounding memory cells, and erroneous reading of data between adjacent threshold voltages. Therefore, a narrow threshold voltage distribution is demanded for memory cells.

Figure 8:
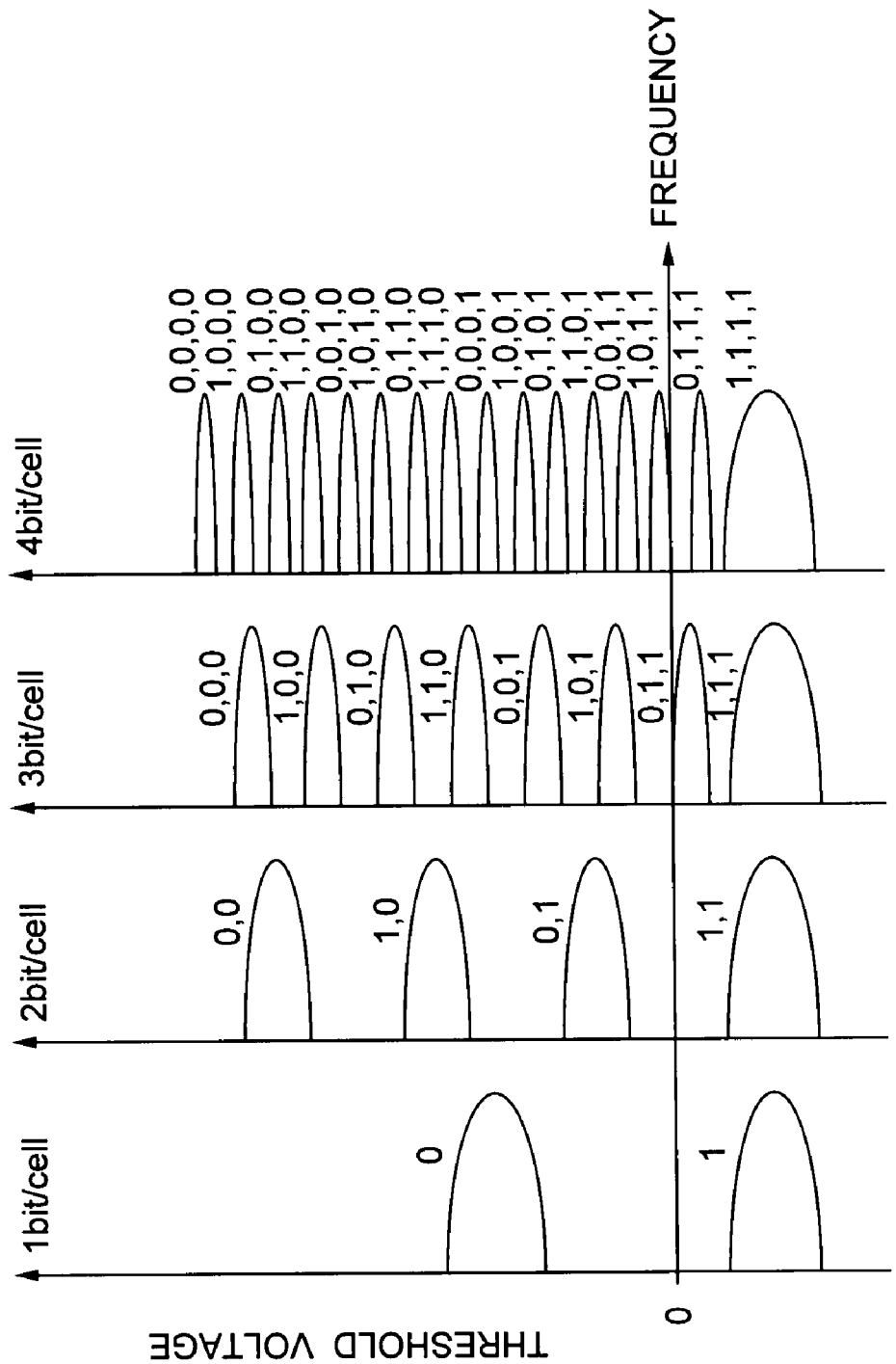
FIG. 8 shows the threshold voltage distribution of a NAND flash memory for storing binary data or multivalued data.

FIG. 8 shows the threshold voltage distribution of a NAND flash memory for storing binary data or multivalued data.

As shown in FIG. 8, as data is multivalued, a narrower threshold voltage distribution is demanded. When a memory cell configured like the prior art is prepared for, e.g., a hexadecimal value, a threshold voltage distribution of about 200 mV to 300 mV can be obtained by setting, at about 30 mV, a step having a writing voltage of $\Delta V_{pgm}$.

However, when the ripple of the boosting circuit increases, it is not possible to properly step up the writing voltage. By using the voltage supply circuit 100 of the first embodiment, the ripple can be reduced to about 100 mV or less. Thus it is possible to achieve desired operations in the NAND flash memory which is a multivalued memory (particularly, for octal and hexadecimal values (8 and 16 threshold voltages)) without causing the foregoing problem (particularly effective for octal and hexadecimal values (8 and 16 threshold voltages)).

As described above, the voltage supply circuit of the present embodiment can respond to multiple set potentials, reduce the dependence of boosting capability on the set potentials, and reduce ripples.

Second Embodiment

The first embodiment described the configuration for controlling the boosting capability of the boosting circuit according to, for example, the output voltage and the set voltage.

The present embodiment will further describe a configuration for controlling a filter circuit according to an output voltage and a set voltage. As in the first embodiment, a voltage supply circuit according to a second embodiment is applicable to a semiconductor memory such as a NAND flash memory.

Figure 9:
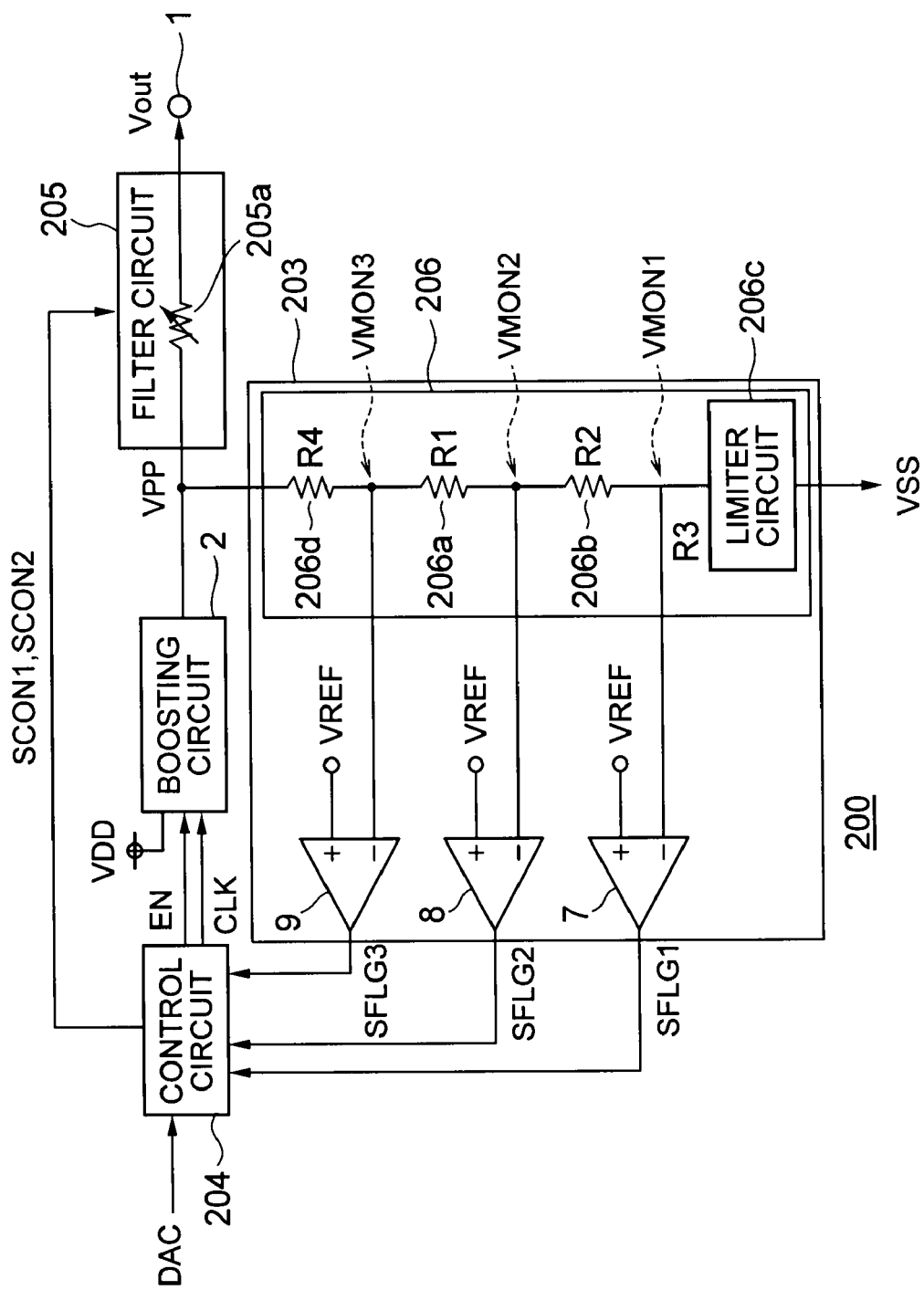
FIG. 9 shows a configuration of the main part of a voltage supply circuit 200 according to a second embodiment which is an aspect of the present invention.

FIG. 9 shows the configuration of the main part of a voltage supply circuit 200 according to the second embodiment which is an aspect of the present invention. In FIG. 9, the same reference numerals as those of the first embodiment indicate the same configurations as those of the first embodiment.

As shown in FIG. 9, the voltage supply circuit 200 includes an output terminal 1, a boosting circuit 2, a voltage detecting circuit 203, a control circuit 204, and a filter circuit 205. The voltage supply circuit 200 switches multiple set voltages in response to a control signal S1 and outputs an output voltage Vout from the output terminal 1.

As in the first embodiment, the boosting circuit 2 outputs a voltage VPP obtained by boosting a voltage supplied from a power supply VDD, to the output terminal 1 through the filter circuit 205.

The voltage detecting circuit 203 includes a voltage dividing circuit 206, a first comparator 7, a second comparator 8, and a third comparator 9.

The voltage dividing circuit 206 includes a resistor 206d which has one end connected to the output of the boosting circuit 2 and has a resistance value of R4, a resistor 206a which has one end connected to the other end of the resistor 206d and has a resistance value of R1, a resistor 206b which has one end connected to the other end of the resistor 206a and has a resistance value of R2, and a limiter circuit 206c which is connected between the other end of the resistor 206b and ground VSS and has a resistance value of R3.

The voltage dividing circuit 206 divides, at a first voltage dividing ratio of (R3)/(R1+R2+R3+R4), the voltage VPP outputted from the boosting circuit 2 and outputs a first monitor voltage VMON1 from the junction of the limiter circuit 206c and the resistor 206b.

Further, the voltage dividing circuit 206 divides, at a second voltage dividing ratio of (R2+R3)/(R1+R2+R3+R4) larger than the first voltage dividing ratio, the voltage VPP outputted from the boosting circuit 2 and outputs a second monitor voltage VMON2 from the junction of the resistor 206b and the resistor 206a.

Moreover, the voltage dividing circuit 206 divides, at a third voltage dividing ratio of (R2+R3+R4)/(R1+R2+R3+R4) larger than the first voltage dividing ratio, the voltage VPP outputted from the boosting circuit 2 and outputs a third monitor voltage VMON3 from the junction of the resistor 206a and the resistor 206d. Particularly, the third voltage dividing ratio is set larger than the second voltage dividing ratio.

The limiter circuit 206c is made up of, for example, a variable resistor. The limiter circuit 206c is controlled so as to reduce the resistance value R3 when a set voltage Vset is high, whereas the limiter circuit 206c is controlled so as to increase the resistance value R3 when the set voltage Vset is low. Thus the first, second, and third voltage dividing ratios are controlled according to the set voltage Vset.

The first comparator 7 has the inverting input terminal fed with the first monitor voltage VMON1 and the non-inverting input terminal fed with a reference voltage VREF and outputs a first flag signal SFLG1 to the control circuit 204.

The second comparator 8 has the inverting input terminal fed with the second monitor voltage VMON2 and the non-inverting input terminal fed with the reference voltage VREF and outputs a second flag signal SFLG2 to the control circuit 204.

The third comparator 9 has the inverting input terminal fed with the third monitor voltage VMON3 and the non-inverting input terminal fed with the reference voltage VREF and outputs a third flag signal SFLG3 to the control circuit 204.

In this configuration, when the voltage detecting circuit 203 detects that the voltage VPP outputted from the boosting circuit 2 is not lower than the set voltage Vset, the voltage detecting circuit 203 outputs the first flag signal SFLG1. Further, when the voltage detecting circuit 203 detects that the voltage VPP outputted from the boosting circuit 2 is not lower than a frequency adjusting voltage Vf set lower than the set voltage Vset, the voltage detecting circuit 203 outputs the second flag signal SFLG2. Moreover, when the voltage detecting circuit 203 detects that the voltage VPP outputted from the boosting circuit 2 is not lower than a resistance adjusting voltage Vr set lower than the set voltage Vset, the voltage detecting circuit 203 outputs the third flag signal SFLG3.

The filter circuit 205 includes a variable resistor 205a connected between the output of the boosting circuit 2 and the output terminal 1. The filter circuit 205 filters the voltage VPP outputted from the boosting circuit 2 and reduces the ripple of the output voltage Vout.

As in the first embodiment, the control circuit 204 controls the boosting operation of the boosting circuit 2 according to the set voltage Vset and the voltage VPP outputted from the boosting circuit 2. In other words, the control circuit 204 outputs an enable signal EN and a clock signal CLK to the boosting circuit 2 in response to the control signal S1 including information about the set voltage Vset and the output signals (SFLG1 and SFLG2) of the voltage detecting circuit 203. The enable signal EN activates the boosting circuit 2, and the boosting circuit 2 performs a boosting operation in response to the clock signal CLK.

For example, the control circuit 204 changes the frequency of the clock signal CLK from a first frequency f1 to a second frequency f2 lower than the first frequency f1 in response to the second flag signal SFLG2, so that the activated boosting circuit 2 is controlled to have a lower boosting capability. Further, the control circuit 204 stops the output of the enable signal EN in response to the first flag signal SFLG1, so that the activated boosting circuit 2 is controlled to be deactivated.

Moreover, when the set voltage Vset is changed to a higher voltage, the control circuit 204 increases the first frequency f1 to improve the boosting capability of the boosting circuit 2. When the set voltage Vset is changed to a lower voltage, the control circuit 204 reduces the first frequency f1 to reduce the boosting capability of the boosting circuit 2.

The control circuit 204 may increase, when the set voltage Vset is changed to a higher voltage, the second frequency f2 to improve the boosting capability of the boosting circuit 2 near the set voltage Vset.

Further, the control circuit 204 may reduce, when the set voltage Vset is changed to a lower voltage, the second frequency f2 to reduce the boosting capability of the boosting circuit 2 near the set voltage Vset.

Moreover, the control circuit 204 may increase the first frequency f1 and the second frequency f2 when the set voltage Vset is changed to a higher voltage.

Further, the control circuit 204 may reduce the first frequency f1 and the second frequency f2 when the set voltage Vset is changed to a lower voltage.

The control circuit 204 controls the variable resistor 205a of the filter circuit 205 according to the set voltage Vset and the voltage VPP outputted from the boosting circuit 2. In other words, the control circuit 204 outputs controls signals (SCON1, SCON2) to the filter circuit 205 in response to the control signal S1 and the output signal (SFLG3) of the voltage detecting circuit 203. The resistance value of the variable resistor 205a of the filter circuit 205 is controlled by the control signals (SCON1, SCON2).

For example, the control circuit 204 controls the filter circuit 205 so as to change the resistance value of the variable resistor 205a from a resistance value r1 to a second resistance value r2 higher than the first resistance value r1 in response to the third flag signal SFLG3. Thus the filter circuit 205 further suppresses a ripple.

Further, when the set voltage Vset is changed to a higher voltage, the control circuit 204 reduces the first resistance value r1 to increase the response of the output voltage Vout to the voltage VPP. When the set voltage Vset is changed to a lower voltage, the control circuit 204 reduces the first resistance value r1 to reduce the response of the output voltage Vout to the voltage VPP.

The control circuit 204 may reduce, when the set voltage Vset is changed to a higher voltage, the first resistance value r1 and the second resistance value r2.

Further, the control circuit 204 may increase, when the set voltage Vset is changed to a lower voltage, the first resistance value r1 and the second resistance value r2.

Figure 10:
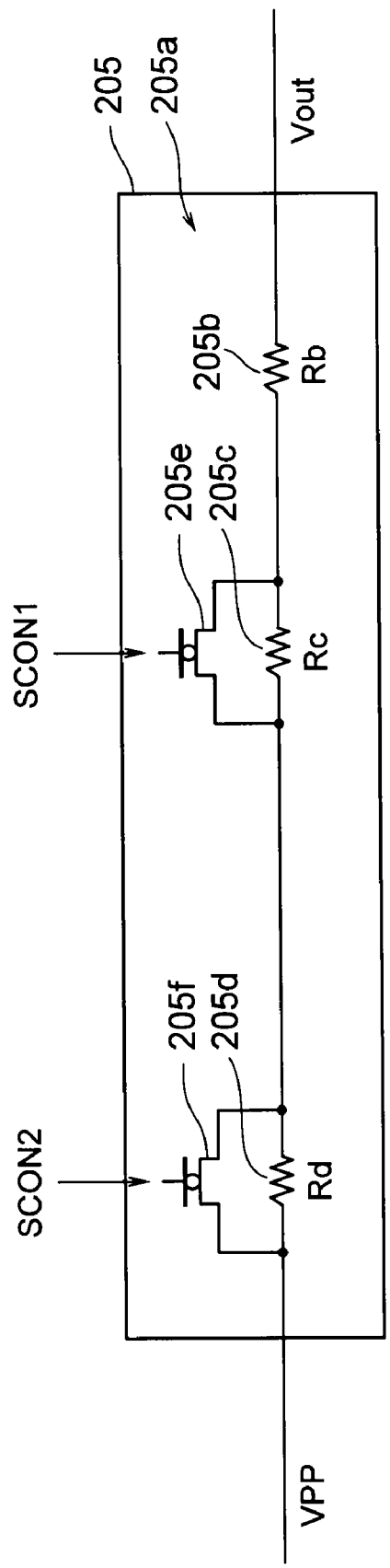
FIG. 10 is a circuit diagram showing the example of the filter circuit applied to the voltage supply circuit 200 of FIG. 9.

The following is an example of the specific configuration of the filter circuit 205. FIG. 10 is a circuit diagram showing the example of the filter circuit applied to the voltage supply circuit 200 of FIG. 9.

As shown in FIG. 10, the variable resistor 205a of the filter circuit 205 includes a resistor 205b having a resistance value Rb, a resistor 205c having a resistance value Rc, a resistor 205d having a resistance value Rd, a p-type MOS transistor 205e which is a switch circuit, and a p-type MOS transistor 205f which is a switch circuit. In this configuration, Rd>Rc is satisfied.

The resistors 205b, 205c and 205d are connected in series between the output of the boosting circuit 2 and the output terminal 1. The p-type MOS transistor 205e is connected in parallel with the resistor 205c. The p-type MOS transistor 205f is connected in parallel with the resistor 205d.

The p-type MOS transistors 205e and 205f are turned on/off in response to the control signals (SCON1, SCON2). Thus the resistance value of the variable resistor 205a is adjusted to Rb, (Rb+Rc), (Rb+Rd), or (Rb+Rc+Rd).

For example, when the set voltage Vset is changed to a higher value, the control circuit 204 outputs the control signals (SCON1, SCON2) to the filter circuit 205 and controls the first resistance value r1 to Rb and the second resistance value r2 to (Rb+Rd).

When the set voltage Vset is changed to a lower voltage, the control circuit 204 outputs the control signals (SCON1, SCON2) to the filter circuit 205 and controls the first resistance value r1 to (Rb+Rc) and the second resistance value r2 to (Rb +Rc+Rd).

Figure 11:
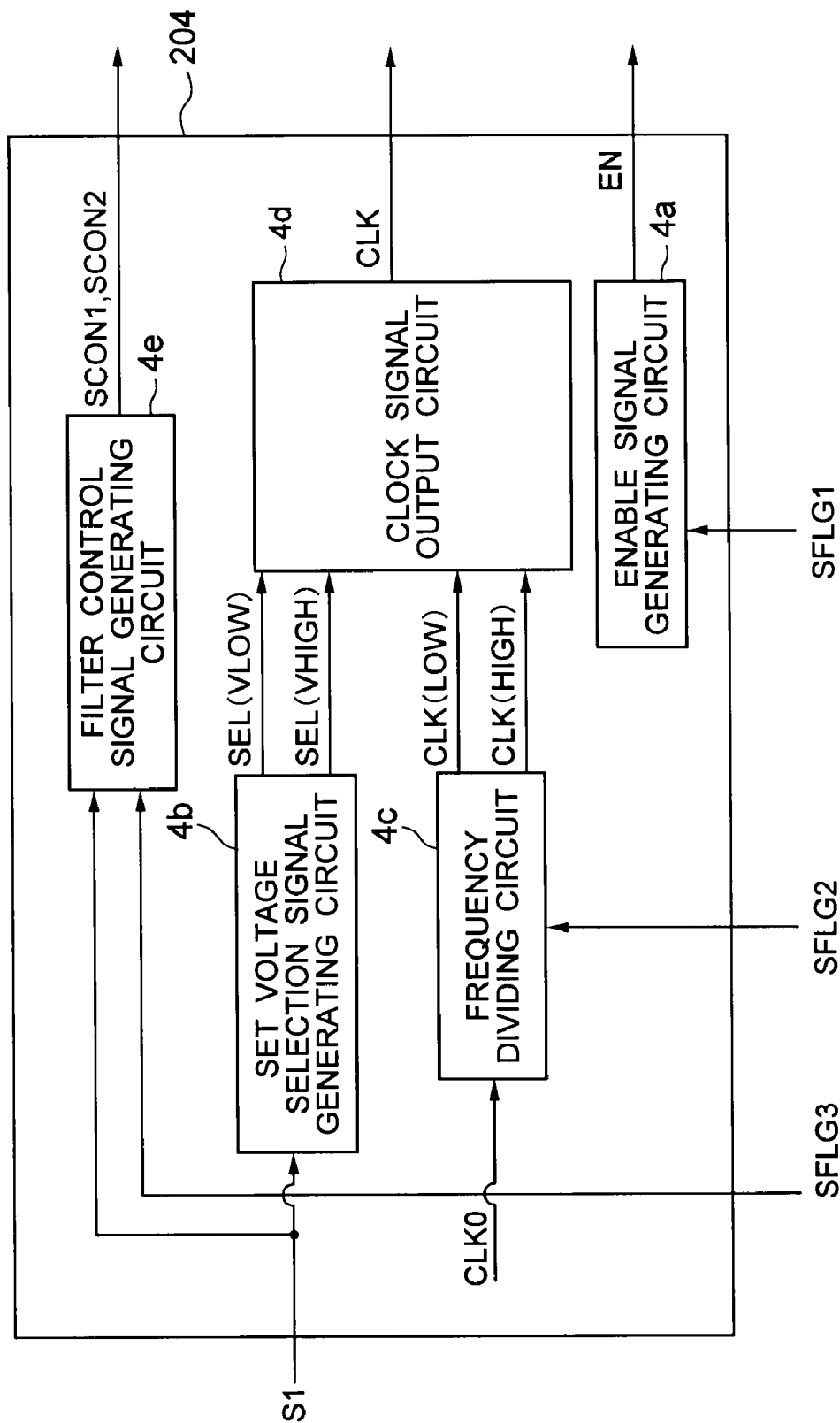
FIG. 11 is a block diagram showing an example of the control circuit applied to the voltage supply circuit 200 of FIG. 9.

The following is an example of the specific configuration of the control circuit 204. FIG. 11 is a block diagram showing an example of the control circuit applied to the voltage supply circuit 200 of FIG. 9.

As shown in FIG. 11, the control circuit 204 includes an enable signal generating circuit 4a, a set voltage selection signal generating circuit 4b, a frequency dividing circuit 4c, a clock signal output circuit 4d, and a filter control signal generating circuit 4e.

The configurations and operations of the enable signal generating circuit 4a, the set voltage selection signal generating circuit 4b, the frequency dividing circuit 4c, and the clock signal output circuit 4d are similar to the configurations and operations in the control circuit 4 of the first embodiment.

The filter control signal generating circuit 4e which has a different configuration from the first embodiment outputs the control signals (SCON1, SCON2) to the filter circuit 205 in response to the control signal S1 and the output signal (SFLG3) of the voltage detecting circuit 203. As described above, the resistance value of the variable resistor 205a of the filter circuit 205 is controlled by the control signals (SCON1, SCON2).

As in the first embodiment, for example, when the set voltage Vset is changed to a higher voltage, the control circuit 204 increases the first frequency f1 and the second frequency f2 of the clock signal for controlling the boosting operation of the boosting circuit 2. When the set voltage Vset is changed to a lower voltage, the control circuit 204 reduces the first frequency f1 and the second frequency f2.

Thus when the boosting operation is performed by the boosting circuit 2 in response to the clock signal having the first frequency f1, the rising speed of the output voltage Vout can be made more uniform regardless of the output voltage Vout.

Figure 12:
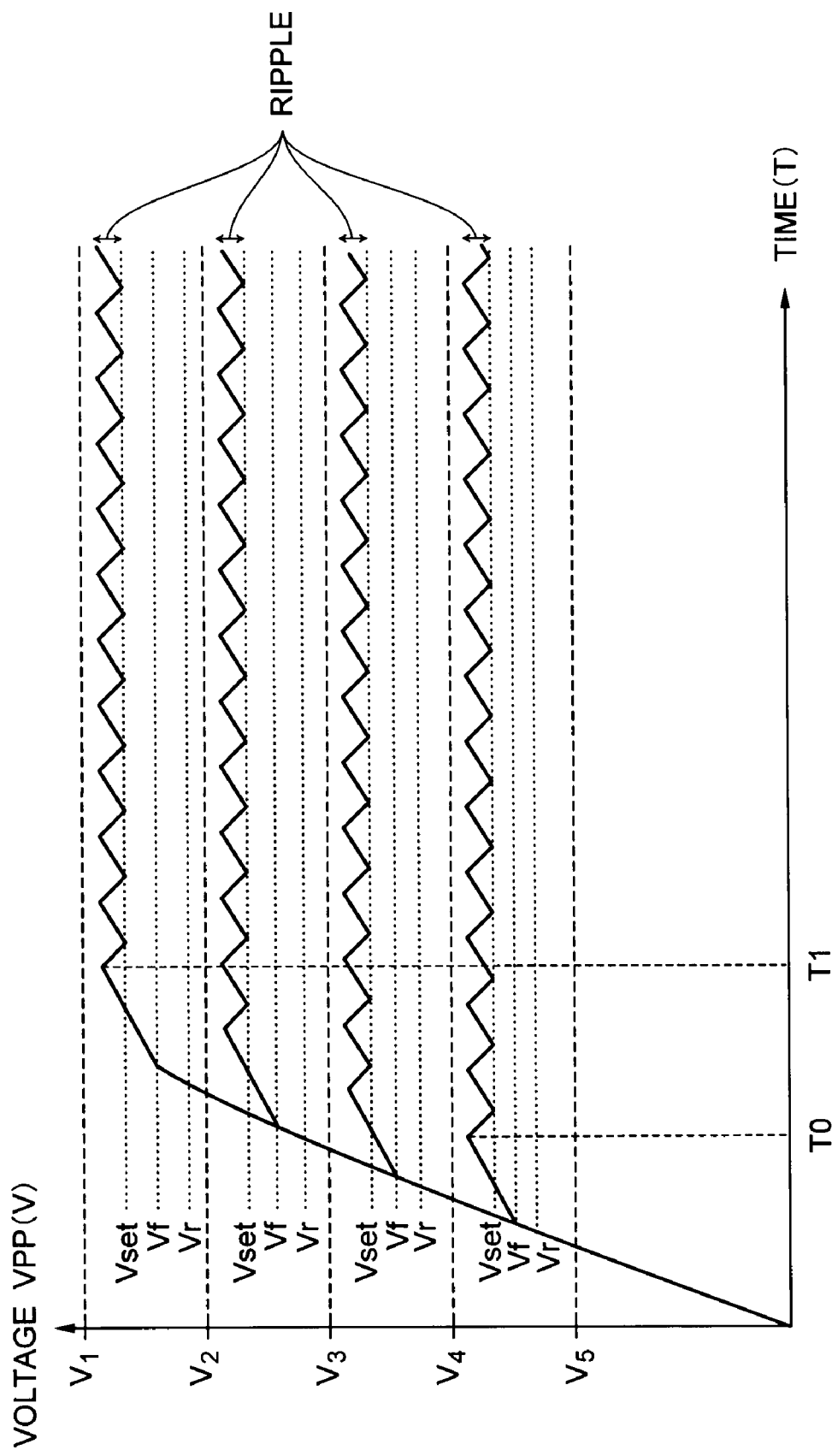
FIG. 12 shows the relationship between a time and a voltage outputted from the boosting circuit 2 of the voltage supply circuit 200 according to the second embodiment of the present invention.
Figure 13:
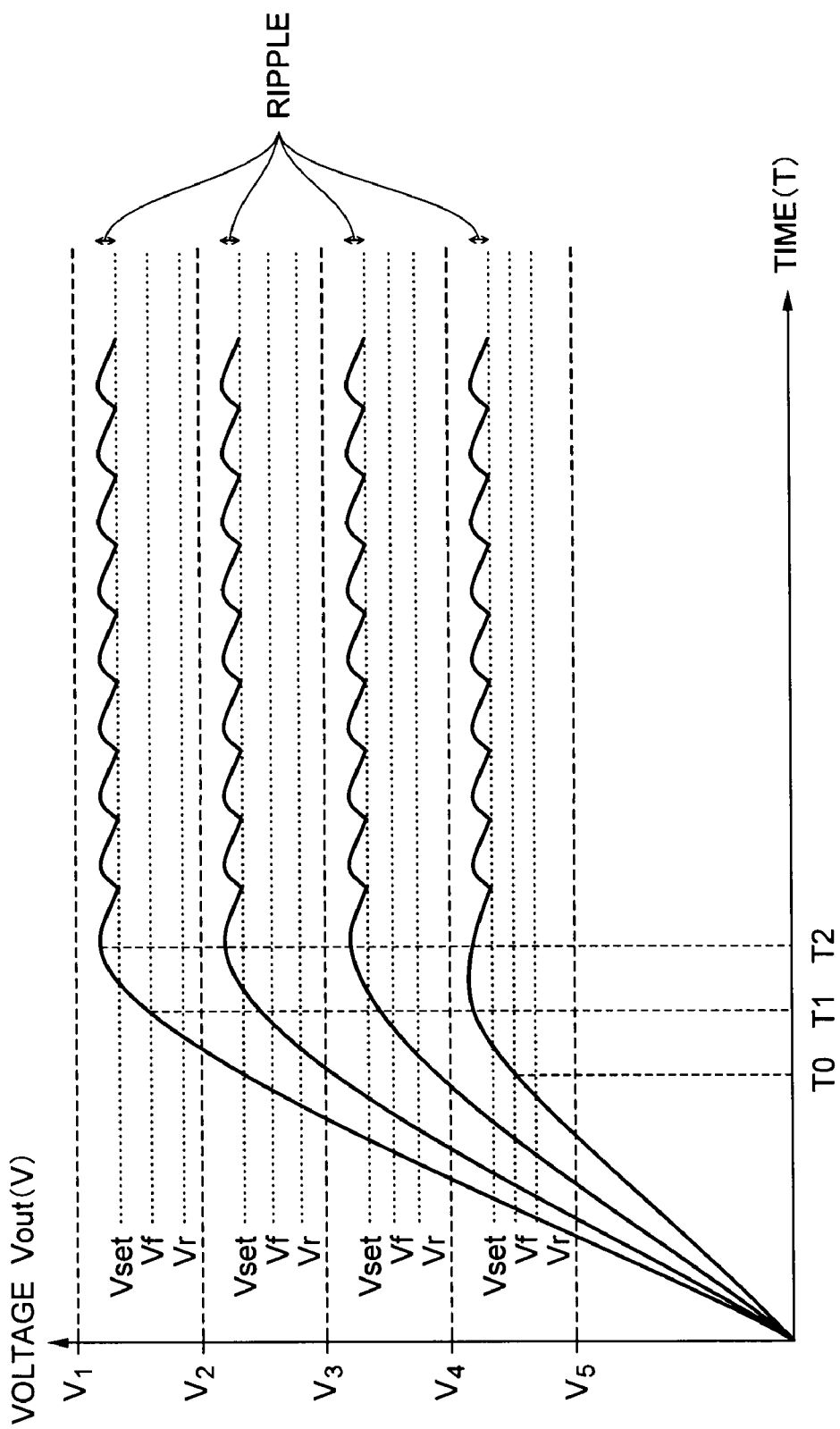
FIG. 13 shows the relationship between a time and the output voltage of the voltage supply circuit 200 according to the second embodiment of the present invention.

FIG. 12 shows the relationship between a time and a voltage outputted from the boosting circuit 2 of the voltage supply circuit 200 according to the second embodiment of the present invention. FIG. 13 shows the relationship between a time and the output voltage of the voltage supply circuit 200 according to the second embodiment of the present invention.

For example, as shown in FIGS. 12 and 13, the boosting operation is performed near the set voltage Vset by the boosting circuit 2 in response to the clock signal having the second frequency f2 (time T0 to time T1). Further, as described above, the control circuit 204 controls the variable resistor 205a of the filter circuit 205 according to the set voltage Vset and the voltage VPP outputted from the boosting circuit 2.

Thus the rising speed and ripples of the output voltage Vout can be made more uniform regardless of the output voltage Vout (at time T2 and subsequent times in FIG. 13). The output voltage Vout is delayed by the delay time of the filter circuit 205 and rises behind the voltage VPP outputted from the boosting circuit 2.

As described above, the voltage supply circuit of the present embodiment can respond to multiple set potentials, reduce the dependence of boosting capability on the set potentials, and reduce ripples (particularly effective for octal and hexadecimal values (8 and 16 threshold voltages)).

As described above, the third voltage dividing ratio is set larger than the second voltage dividing ratio in the voltage detecting circuit 203. In other words, the forward bias voltage Vf is set higher than the resistance adjusting voltage Vr. Thus the resistance value of the filter circuit 205 is increased before the boosting capability of the boosting circuit 2 is set lower. Therefore, it is possible to reduce the ripples of the output voltage Vout while keeping the boosting capability of the boosting circuit 2 as high as possible and increasing the rising speed of the output voltage Vout (particularly effective for octal and hexadecimal values (8 and 16 threshold voltages)).

In the foregoing embodiments, the voltage supply circuit is applied to a NAND flash memory. The voltage supply circuit may be applied to a semiconductor memory such as a NOR EEPROM, a DINOR EEPROM, and an AND EEPROM and a circuit and the like requiring a potential boosted higher than the power supply VCC.

What is claimed is:

1. A semiconductor memory, comprising:
    memory cells; and
    a voltage supply circuit that switches and outputs multiple set voltages from an output terminal and supplies a voltage to the memory cells,
    the voltage supply circuit comprising:
    a boosting circuit that boosts a voltage supplied from a power supply and outputs the voltage to the output terminal;
    a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage; and
    a control circuit that controls an operation of the boosting circuit in response to the set voltage and the output signal of the voltage detecting circuit,
    wherein the control circuit controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal,
    controls the activated boosting circuit so as to deactivate the boosting circuit in response to the first flag signal,
    increases at least the second frequency when the set voltage is changed to a higher voltage, and
    reduces at least the second frequency when the set voltage is changed to a lower voltage.

2. The semiconductor memory according to claim 1, wherein the voltage detecting circuit comprises:
    a voltage dividing circuit that outputs a first monitor voltage by dividing the voltage outputted from the boosting circuit at a first voltage dividing ratio, and outputs a second monitor voltage by dividing the voltage outputted from the boosting circuit at a second voltage dividing ratio larger than the first voltage dividing ratio;
    a first comparator that has an inverting input terminal fed with the first monitor voltage and a non-inverting input terminal fed with a reference voltage, and outputs the first flag signal; and
    a second comparator has an inverting input terminal fed with the second monitor voltage and a non-inverting input terminal fed with the reference voltage, and outputs the second flag signal.

3. The semiconductor memory according to claim 1, wherein the control circuit increases the first frequency and the second frequency when the set voltage is changed to a higher voltage, and reduces the first frequency and the second frequency when the set voltage is changed to a lower voltage.

4. The semiconductor memory according to claim 2, wherein the control circuit increases the first frequency and the second frequency when the set voltage is changed to a higher voltage, and reduces the first frequency and the second frequency when the set voltage is changed to a lower voltage.

5. The semiconductor memory according to claim 1, wherein on the memory cells, 16 threshold voltages for storing data can be set by changing a quantity of electron stored in floating gates of the memory cells.

6. The semiconductor memory according to claim 1, wherein on the memory cells, 8 threshold voltages for storing data can be set by changing a quantity of electron stored in floating gates of the memory cells.

7. A semiconductor memory, comprising:
    memory cells; and
    a voltage supply circuit that switches and outputs multiple set voltages from an output terminal and supplies a voltage to the memory cells,
    the voltage supply circuit comprising:
    a boosting circuit that boosts a voltage supplied from a power supply and outputs the voltage to the output terminal;
    a filter circuit which has a variable resistor connected between an output of the boosting circuit and the output terminal and filters the voltage outputted from the boosting circuit;
    a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage, and outputs a third flag signal when detecting that the voltage outputted from the boosting circuit is not lower than a resistance adjusting voltage set lower than the set voltage; and
    a control circuit that controls an operation of the boosting circuit in response to the set voltage and the output signal of the voltage detecting circuit, and controls the filter circuit at least in response to the output signal of the voltage detecting circuit,
    wherein the control circuit controls the filter circuit so as to change a resistance value of the variable resistor from a first resistance value to a second resistance value larger than the first resistance value in response to the third flag signal,
    controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal,
    controls the activated boosting circuit so as to deactivate the boosting circuit in response to the first flag signal,
    increases at least the second frequency when the set voltage is changed to a higher voltage, and
    reduces at least the second frequency when the set voltage is changed to a lower voltage.

8. The semiconductor memory according to claim 2, wherein the control circuit reduces at least the first resistance value when the set voltage is changed to a higher voltage, and increases at least the first resistance value when the set voltage is changed to a lower voltage.

9. The semiconductor memory according to claim 7, wherein the voltage detecting circuit comprises:
    a voltage dividing circuit that outputs a first monitor voltage by dividing the voltage outputted from the boosting circuit at a first voltage dividing ratio, outputs a second monitor voltage by dividing the voltage outputted from the boosting circuit at a second voltage dividing ratio larger than the first voltage dividing ratio, and outputs a third monitor voltage by dividing the voltage outputted from the boosting circuit at a third voltage dividing ratio larger than the first voltage dividing ratio;
    a first comparator that has an inverting input terminal fed with the first monitor voltage and a non-inverting input terminal fed with a reference voltage, and outputs the first flag signal;

a second comparator has an inverting input terminal fed with the second monitor voltage and a non-inverting input terminal fed with the reference voltage, and outputs the second flag signal; and a third comparator has an inverting input terminal fed with the third monitor voltage and a non-inverting input terminal fed with the reference voltage, and outputs the third flag signal.

10. The semiconductor memory according to claim 8, wherein the voltage detecting circuit comprises:

a voltage dividing circuit that outputs a first monitor voltage by dividing the voltage outputted from the boosting circuit at a first voltage dividing ratio, outputs a second monitor voltage by dividing the voltage outputted from the boosting circuit at a second voltage dividing ratio larger than the first voltage dividing ratio, and outputs a third monitor voltage by dividing the voltage outputted from the boosting circuit at a third voltage dividing ratio larger than the first voltage dividing ratio;

a first comparator that has an inverting input terminal fed with the first monitor voltage and a non-inverting input terminal fed with a reference voltage, and outputs the first flag signal;

a second comparator has an inverting input terminal fed with the second monitor voltage and a non-inverting input terminal fed with the reference voltage, and outputs the second flag signal; and a third comparator has an inverting input terminal fed with the third monitor voltage and a non-inverting input terminal fed with the reference voltage, and outputs the third flag signal.

11. The semiconductor memory according to claim 7, wherein the frequency adjusting voltage is set higher than the resistance adjusting voltage.

12. The semiconductor memory according to claim 7, wherein the control circuit increases the first frequency and the second frequency when the set voltage is changed to a higher voltage, and reduces the first frequency and the second frequency when the set voltage is changed to a lower voltage.

13. The semiconductor memory according to claim 8, wherein the control circuit increases the first frequency and the second frequency when the set voltage is changed to a higher voltage, and reduces the first frequency and the second frequency when the set voltage is changed to a lower voltage.

14. The semiconductor memory according to claim 7, wherein on the memory cells, 16 threshold voltages for storing data can be set by changing a quantity of electron stored in floating gates of the memory cells.

15. The semiconductor memory according to claim 7, wherein on the memory cells, 8 threshold voltages for storing data can be set by changing a quantity of electron stored in floating gates of the memory cells.

16. A voltage supply circuit that switches and outputs multiple set voltages from an output terminal, comprising:

a boosting circuit that boosts a voltage supplied from a power supply and outputs the voltage to the output terminal;

a voltage detecting circuit that outputs a first flag signal when detecting that the voltage outputted from the boosting circuit is not lower than the set voltage, outputs a second flag when detecting that the voltage outputted from the boosting circuit is not lower than a frequency adjusting voltage set lower than the set voltage; and a control circuit that controls an operation of the boosting circuit in response to the set voltage and the output signal of the voltage detecting circuit, wherein the control circuit controls boosting capability of the activated boosting circuit so as to reduce the boosting capability by changing a frequency of a clock signal for causing the boosting circuit to perform a boosting operation, from a first frequency to a second frequency lower than the first frequency in response to the second flag signal, controls the activated boosting circuit so as to deactivate the boosting circuit in response to the first flag signal, increases at least the second frequency when the set voltage is changed to a higher voltage, and reduces at least the second frequency when the set voltage is changed to a lower voltage.

17. The voltage supply circuit according to claim 16, wherein the voltage detecting circuit comprises:

a voltage dividing circuit that outputs a first monitor voltage by dividing the voltage outputted from the boosting circuit at a first voltage dividing ratio, and outputs a second monitor voltage by dividing the voltage outputted from the boosting circuit at a second voltage dividing ratio larger than the first voltage dividing ratio;

a first comparator that has an inverting input terminal fed with the first monitor voltage and a non-inverting input terminal fed with a reference voltage, and outputs the first flag signal; and a second comparator has an inverting input terminal fed with the second monitor voltage and a non-inverting input terminal fed with the reference voltage, and outputs the second flag signal.

18. The voltage supply circuit according to claim 16, wherein the control circuit increases the first frequency and the second frequency when the set voltage is changed to a higher voltage, and reduces the first frequency and the second frequency when the set voltage is changed to a lower voltage.

19. The voltage supply circuit according to claim 17, wherein the control circuit increases the first frequency and the second frequency when the set voltage is changed to a higher voltage, and reduces the first frequency and the second frequency when the set voltage is changed to a lower voltage.

* * * * *